US011750184B1

(12) United States Patent
Quan et al.

(10) Patent No.: US 11,750,184 B1
(45) Date of Patent: Sep. 5, 2023

(54) GLITCH REMOVAL CIRCUIT

(71) Applicant: Montage Electronics (Shanghai) Co., Ltd., Shanghai (CN)

(72) Inventors: Li Quan, Shanghai (CN); Xuexin Ding, Shanghai (CN); Liang Zhang, Shanghai (CN); Zhongyuan Chang, Shanghai (CN); Yufei Gu, Shanghai (CN); Lixin Jiang, Shanghai (CN); Gang Yan, Shanghai (CN); Zongjie Hu, Shanghai (CN)

(73) Assignee: Montage Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/876,503

(22) Filed: Jul. 28, 2022

(30) Foreign Application Priority Data

Mar. 17, 2022 (CN) .......................... 202210267104.3

(51) Int. Cl.
H03K 5/00 (2006.01)
H03K 5/1534 (2006.01)
H03K 5/1252 (2006.01)
H03K 5/01 (2006.01)

(52) U.S. Cl.
CPC ......... *H03K 5/1534* (2013.01); *H03K 5/1252* (2013.01); *H03K 5/01* (2013.01)

(58) Field of Classification Search
CPC ....... H03K 5/1534; H03K 5/1252; H03K 5/01
See application file for complete search history.

(56) References Cited

U.S. PATENT DOCUMENTS

| 3,942,042 A * | 3/1976 | Nikami | H03K 3/037 360/64 |
| 4,937,468 A * | 6/1990 | Shekhawat | H03K 17/61 327/227 |
| 5,003,196 A * | 3/1991 | Kawaguchi | H03K 5/082 327/60 |
| 5,418,485 A * | 5/1995 | Duret | G06K 19/07 327/227 |
| 5,638,016 A * | 6/1997 | Eitrheim | H03K 5/1565 327/299 |
| 7,920,010 B2 * | 4/2011 | Chen, Jr. | H01F 19/08 327/306 |
| 2003/0091135 A1 * | 5/2003 | Bonafos | H03K 5/1252 375/350 |
| 2007/0229124 A1 * | 10/2007 | Tokuno | H03K 17/162 327/112 |

(Continued)

*Primary Examiner* — Tuan T Lam
(74) *Attorney, Agent, or Firm* — JCIPRNET

(57) ABSTRACT

The disclosure provides a glitch removal circuit with low latency. The glitch removal circuit includes a first signal edge detector, a second signal edge detector, a latch, and a control signal generator. The first signal edge detector is activated according to the first control signal to detect the rising edge of the input signal to generate the first detection result. The second signal edge detector is activated according to the second control signal to detect the falling edge of the input signal to generate the second detection result. The latch sets the generated output signal according to the first detection result, and clears the generated output signal according to the second detection result. The control signal generator shields the glitch on the input signal to generate a processed signal, and generates a first control signal and a second control signal according to the processed signal.

12 Claims, 6 Drawing Sheets

(56) References Cited

U.S. PATENT DOCUMENTS

2011/0148475 A1\* 6/2011 Lin ................ H03K 19/01721
                                                                              327/109
2018/0123576 A1\* 5/2018 Chan .................... H03K 5/1565
2018/0159527 A1\* 6/2018 Lee ...................... H03K 3/0233

\* cited by examiner

GLITCH REMOVAL CIRCUIT

CROSS-REFERENCE TO RELATED APPLICATION

This application claims the priority benefit of China application serial no. 202210267104.3, filed on Mar. 17, 2022. The entirety of the above-mentioned patent application is hereby incorporated by reference herein and made a part of this specification.

BACKGROUND

Technical Field

The disclosure relates to a glitch removal circuit, and particularly relates to a low latency signal glitch removal circuit.

Description of Related Art

In the field of chip applications, the interactive communication between integrated circuit devices involves the use of a high-speed transmission protocol, such as an improved inter integrated circuit interface (I3C). The key function of the I3C transmission bus is to maximize the speed of data transmission while maintaining the basic functionality of the integrated circuit. However, in practical applications, the integrated circuit devices involved in the communication of the bus protocol will cause noise coupling or ground bounce to the bus signal. These interferences can easily cause the jitter of the bus signal and cause uncontrollable signal glitches, thus causing the logic function of the integrated circuit device to be abnormal. In the related art, due to the uncontrollable characteristics of such glitch signals, deglitch circuits with a sufficient amount of resistance-capacitance filter circuits are commonly used to remove these signal glitches. Such resistance-capacitance filter circuit will increase the latency in the process of signal transmission from input to output, which considerably affects the high-speed and low-latency data transmission specifications required by the high-speed transmission protocol.

SUMMARY

The present disclosure is related to a low latency glitch removal circuit.

According to an embodiment of the present disclosure, a glitch removal circuit includes a first signal edge detector, a second signal edge detector, a latch, and a control signal generator. The first signal edge detector receives an input signal and is activated according to the first control signal to detect the rising edge of the input signal to generate a first detection result. The second signal edge detector receives an input signal and is activated according to the second control signal to detect the falling edge of the input signal to generate a second detection result. A latch, which is coupled to the first signal edge detector and the second signal edge detector, sets the generated output signal according to the first detection result, and clears the generated output signal according to the second detection result. The control signal generator generates a processed signal by shielding the glitch on the input signal, and generates the first control signal and the second control signal according to the processed signal.

The glitch removal circuit in the embodiment of the present disclosure generates a plurality of detection results by detecting the rising edge and the falling edge of the input signal, and generates an output signal according to the generated detection results. In this way, the glitch removal circuit may effectively filter out the glitches on the input signal to generate the output signal under the condition of low latency, maintain the real-time nature of signal transmission, and meet the specification requirements of high-speed signal transmission.

BRIEF DESCRIPTION OF THE DRAWINGS

The accompanying drawings are included to provide a further understanding of the present disclosure, and are incorporated in and constitute a part of this specification. The drawings illustrate embodiments of the disclosure and together with the description serve to explain the principles of the disclosure.

DESCRIPTION OF THE EMBODIMENTS

Figure 1:
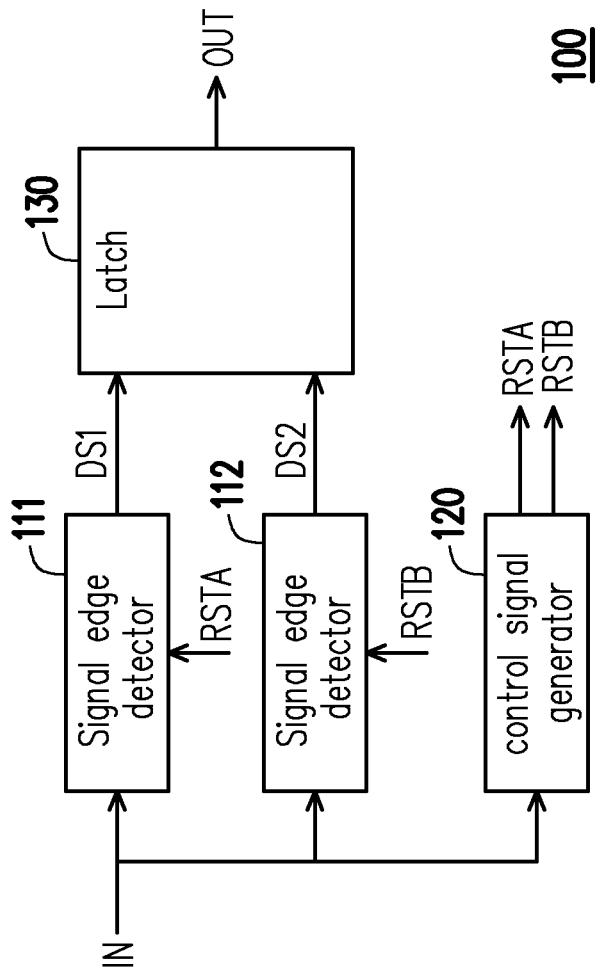
FIG. 1 is a schematic view of a glitch removal circuit according to an embodiment of the present disclosure.

Reference will now be made in detail to the exemplary embodiments of the present disclosure, examples of which are illustrated in the accompanying drawings. Wherever possible, the same reference numerals are used in the drawings and description to refer to the same or like parts.

Please refer to FIG. 1, which is a schematic view of a glitch removal circuit according to an embodiment of the present disclosure. The glitch removal circuit 100 includes signal edge detectors 111 and 112, a control signal generator 120 and a latch 130. The signal edge detector 111 receives an input signal IN. The signal edge detector 111 is activated according to the control signal RSTA to detect the rising edge of the input signal IN to generate a detection result DS1. The signal edge detector 112 also receives the input signal IN. The signal edge detector 112 is activated according to the control signal RSTB to detect the falling edge of the input signal IN to generate the detection result DS2. In this embodiment, the signal edge detectors 111 and 112 are not activated at the same time. The control signals RSTA and RSTB may be mutually inverse signals. When the signal edge detector 111 is activated, the signal edge detector 112 is turned off; and when the signal edge detector 112 is activated, the signal edge detector 111 is turned off.

The latch 130 is coupled to the signal edge detector 111 and the signal edge detector 112. The latch 130 may receive the detection results DS1 and DS2 generated by the signal edge detector 111 and the signal edge detector 112, respectively. The latch 130 may generate the output signal OUT according to the detection results DS1 and DS2. In detail, the latch 130 may set the generated output signal OUT according to the detection result DS1, and clear the generated output signal OUT according to the detection result DS2.

The control signal generator 120 is coupled to the signal edge detectors 111 and 112. The control signal generator 120 generates a processed signal by shielding the glitch on the input signal IN, and generates a control signal RSTA and a control signal RSTB according to the processed signal. Based on the shielding operation of the input signal IN, the control signal generator 120 may not respond according to the glitch on the input signal IN, and may generate the control signal RSTA and the control signal RSTB according to the logic value of the processed signal (without the glitch). In detail, when the processed signal is a logic value of 0, the control signal generator 120 generates the control signal RSTA which enables the signal edge detector 111 to be activated. In addition, when the processed signal is a logic value of 1, the control signal generator 120 generates the control signal RSTB which enables the signal edge detector 112 to be activated.

Because the detection results DS1 and DS2 are generated according to the time points when the rising edge and the falling edge of the input signal IN occur, respectively, the latch 130 sets the output signal OUT according to the detection result DS1 at the time point when the rising edge of the input signal IN occurs, and makes the output signal OUT a logical value of 1. Moreover, the latch 130 clears the output signal OUT according to the detection result DS2 at the time point when the falling edge of the input signal IN occurs, and makes the output signal OUT a logic value of 0.

It should be mentioned that when a falling pulse glitch is generated near the rising edge of the input signal IN, the falling pulse may be shielded and will not occur in the processed signal. Therefore, the signal edge detector 112 is not activated to generate the detection result DS2. That is to say, the falling pulse glitch will not affect the logic value of the output signal OUT. Similarly, when a rising pulse glitch is generated near the falling edge of the input signal IN, the rising pulse may also be shielded and will not occur in the processed signal. Therefore, the signal edge detector 111 is not activated to generate the detection result DS1. That is to say, the rising pulse glitch will not affect the logic value of the output signal OUT.

In this way, the glitch removal circuit 100 may effectively remove the glitch on the input signal IN, and quickly generate the output signal OUT, thereby reducing the time latency between the output signal OUT and the input signal IN.

Incidentally, when the control signal RSTA is the first logic value and the control signal RSTB is the second logic value, the signal edge detector 111 may be activated and the signal edge detector 112 may be turned off. When the control signal RSTA is the second logic value and the control signal RSTB is the first logic value, the signal edge detector 112 may be activated and the signal edge detector 111 may be turned off. The first logic value and the second logic value are complementary to each other, and the first logic value may be a logic value 0 or a logic value 1, which is not specifically limited in the disclosure.

Figure 2:
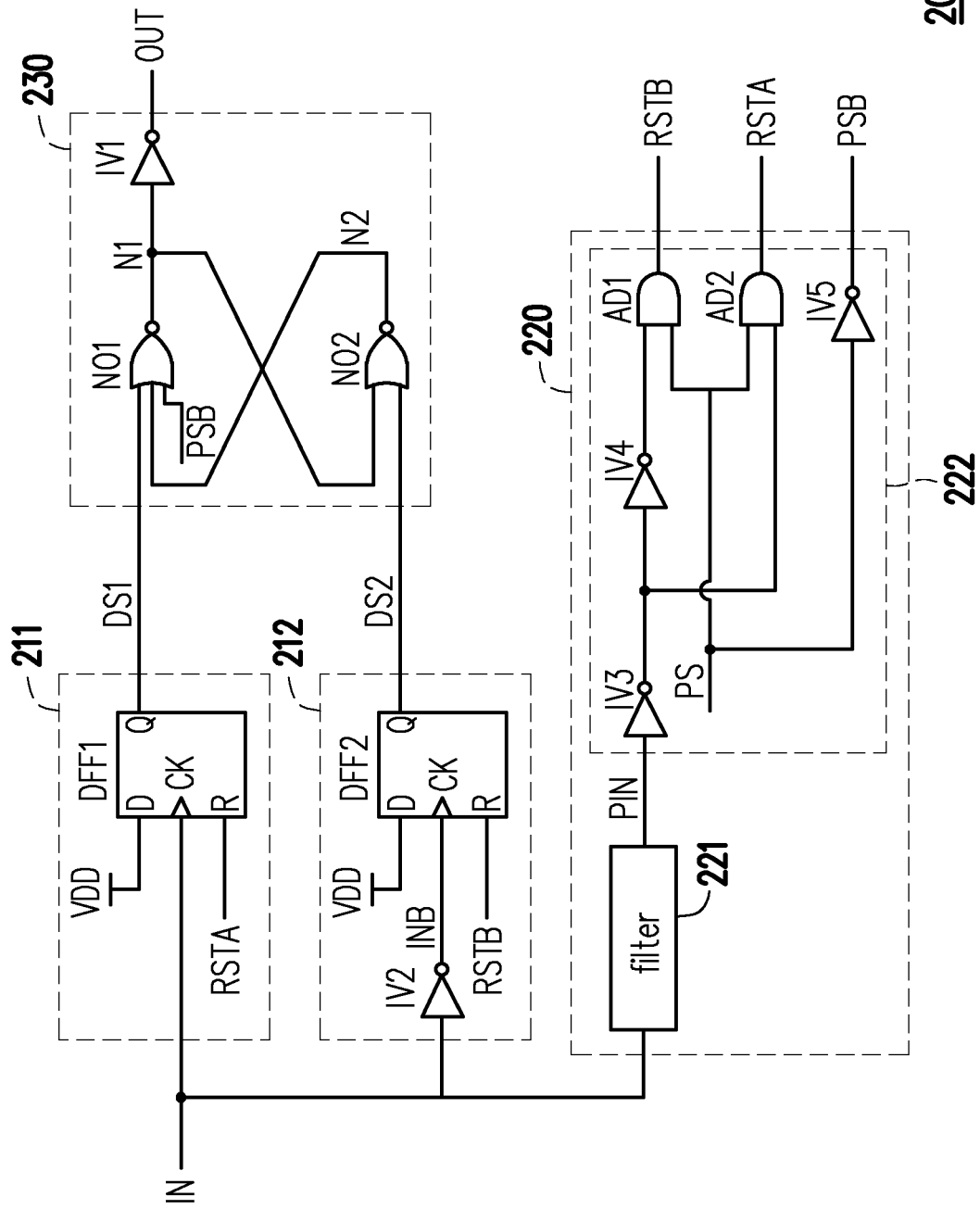
FIG. 2 is a schematic circuit diagram of a glitch removal circuit according to another embodiment of the present disclosure.

Please refer to FIG. 2, which is a schematic circuit diagram of a glitch removal circuit according to another embodiment of the present disclosure. The glitch removal circuit 200 includes signal edge detectors 211 and 212, a control signal generator 220 and a latch 230. The signal edge detector 211 includes a flip-flop DFF1, and the flip-flop DFF1 may be a D-type flip-flop. The flip-flop DFF1 has a data terminal D, a clock terminal CK, a reset terminal R and an output terminal Q. The reset terminal R of the flip-flop DFF1 receives the control signal RSTA, the data terminal D of the flip-flop DFF1 receives the power supply voltage VDD of the first logic value, the clock terminal CK of the flip-flop DFF1 receives the input signal IN, and the output terminal Q of the flip-flop DFF1 generates a detection result DS1.

The signal edge detector 212 includes a flip-flop DFF2 and an inverter IV2. The flip-flop DFF2 may be a D-type flip-flop. The flip-flop DFF2 has a data terminal D, a clock terminal CK, a reset terminal R and an output terminal Q. The reset terminal R of the flip-flop DFF2 receives the control signal RSTB, the data terminal D of the flip-flop DFF2 receives the power supply voltage VDD of the first logic value, the clock terminal CK of the flip-flop DFF2 receives an inverted input signal INB, and the output terminal Q of the flip-flop DFF2 generates the detection result DS2. The inverter IV2 receives the input signal IN and is utilized for generating the inverted input signal INB.

In this embodiment, the first logic value received by the data terminals D of the flip-flops DFF1 and DFF2 may not be provided by the power supply voltage VDD, but may be provided by any circuit component that can generate the first logic value in the circuit, which is not specifically limited in the disclosure.

In this embodiment, when the control signal RSTA is the first logic value (e.g., logic value 1), the flip-flop DFF1 may be activated. Correspondingly, the control signal RSTB is a second logic value (e.g., a logic value 0), and the flip-flop DFF2 is set in a reset state and is not activated. Similarly, when the control signal RSTB is the first logic value (e.g., logic value 1), the flip-flop DFF2 may be activated. Correspondingly, the control signal RSTA is a second logic value (e.g., a logic value 0), and the flip-flop DFF1 is set in a reset state and is not activated.

The flip-flop DFF1 is utilized to be triggered at a time point when the rising edge of the input signal IN occurs, and generates a detection result DS1 according to the first logic value on the data terminal. The flip-flop DFF2 is utilized to be triggered at a time point when the falling edge of the input signal IN occurs, and generates a detection result DS2 according to the first logic value on the data terminal. In addition, when the control signal RSTA makes the flip-flop DFF1 not to be activated, the flip-flop DFF1 may generate the detection result DS1 having the second logic value. Similarly, when the control signal RSTB makes the flip-flop DFF2 not to be activated, the flip-flop DFF2 may generate the detection result DS2 having the second logic value.

The latch 230 includes NOR gates NO1, NO2 and an inverter IV1. The NOR gates NO1 and NO2 are coupled to form an SR-Latch circuit. The NOR gate NO1 receives the detection result DS1, the signal N2 and the control signal PSB to generate the signal N1. The NOR gate NO2 receives the detection result DS2 and the signal N1 to generate the signal N2. The inverter IV1 receives the signal N1 and generates the output signal OUT. When the detection result DS1 is the logic value 1 (the control signal PSB and the detection result DS2 are both the logic value 0), the output signal OUT may be set to the logic value 1. Next, if the detection result DS1 is the logic value 0, and the detection result DS2 is changed to the logic value 1, the output signal OUT may be cleared to the logic value 0.

The control signal generator 220 includes a filter 221 and a logic circuit 222. The logic circuit 222 includes inverters IV3 to IV5, an AND gate AD1 and an AND gate AD2. The filter 221 is utilized for receiving the input signal IN and shielding the glitch on the input signal IN to generate the processed signal PIN. The inverters IV3 and IV4 are connected in series between the filter 221 and the AND gate AD1 in sequence. The AND gate AD1 receives the signal from the output terminal of the inverter IV4 and the control signal PS, and generates the control signal RSTB accordingly. The AND gate AD2 receives the signal from the output terminal of the inverter IV3 and the control signal PS, and generates the control signal RSTA accordingly. The control signal PS may be a power on reset signal of the circuit system. The inverter IV5 receives the control signal PS and generates the control signal PSB.

In this embodiment, the filter 221 may be any form of resistance-capacitance filter, and the disclosure provides no specific limitation thereto. The filter 221 may be used to shield glitches with a width of less than 15 nanoseconds in the input signal IN to generate the processed signal PIN.

Figure 3:
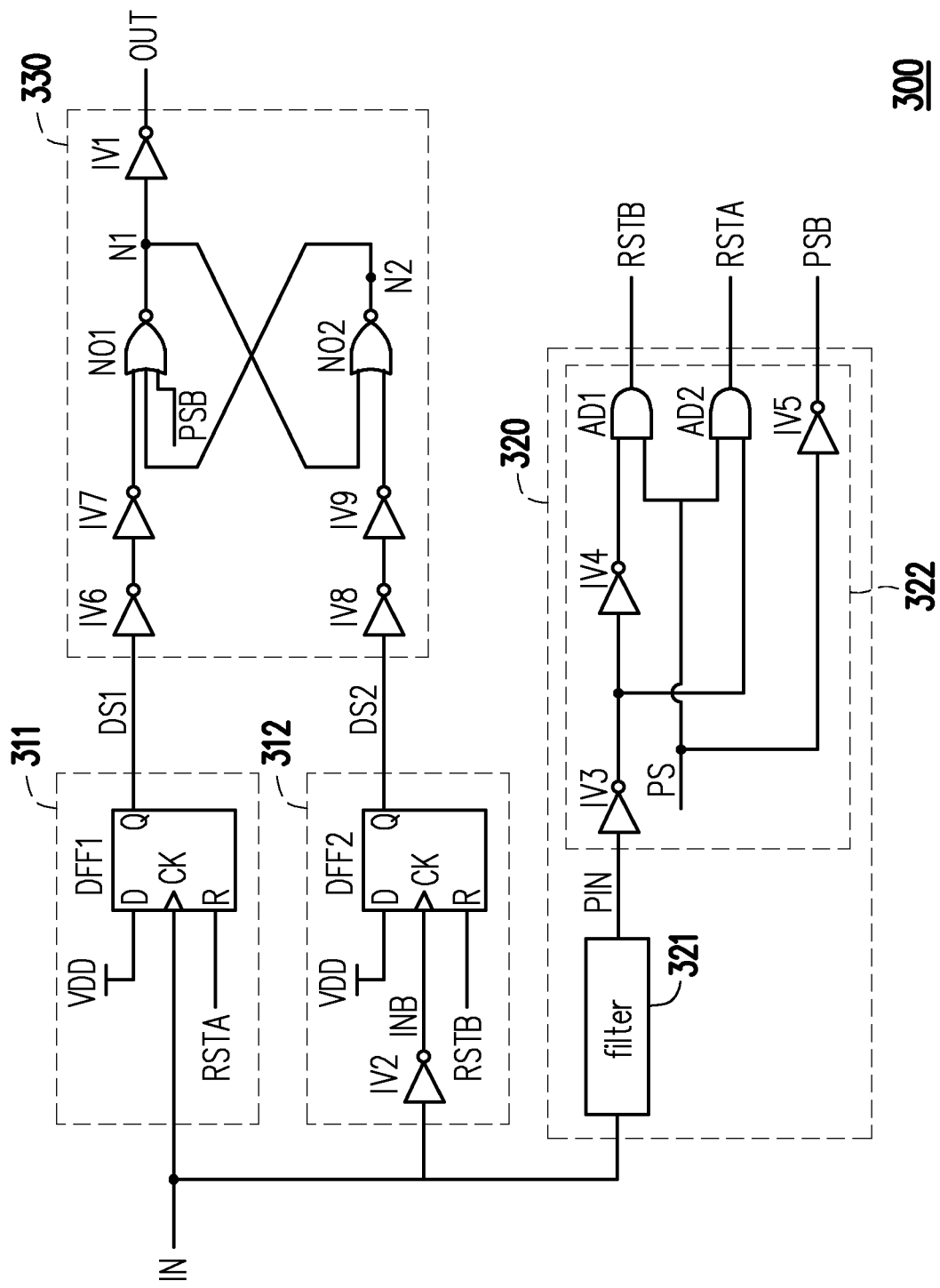
FIG. 3 is a schematic circuit diagram of a glitch removal circuit according to another embodiment of the present disclosure.

Please refer to FIG. 3 below. FIG. 3 is a schematic circuit diagram of a glitch removal circuit according to another embodiment of the present disclosure. The glitch removal circuit 300 includes signal edge detectors 311 and 312, a control signal generator 320 and a latch 330. The control signal generator 320 includes a filter 321 and a logic circuit 322. The glitch removal circuit 300 is substantially the same as the glitch removal circuit 200, and the same descriptions are not repeated here. Different from the embodiment shown in FIG. 2, the latch 330 of this embodiment further includes inverters IV6 to IV9. The even-numbered inverters IV6 to IV7 are connected in series between the signal edge detector 311 and the NOR gate NO1. The even-numbered inverters IV8 to IV9 are connected in series between the signal edge detector 312 and the NOR gate NO2.

It should be mentioned that in this embodiment, the number of inverters IV6 to IV7 connected in series between the signal edge detector 311 and the NOR gate NO1 is two. In other embodiments, the number of inverters connected in series between the signal edge detector 311 and the NOR gate NO1 may be any even number, which is not specifically limited in the disclosure. Similarly, the number of inverters IV8 to IV9 connected in series between the signal edge detector 312 and the NOR gate NO2 is two. In other embodiments, the number of inverters connected in series between the signal edge detector 312 and the NOR gate NO2 may be any even number, which is not specifically limited in the disclosure.

Figure 4:
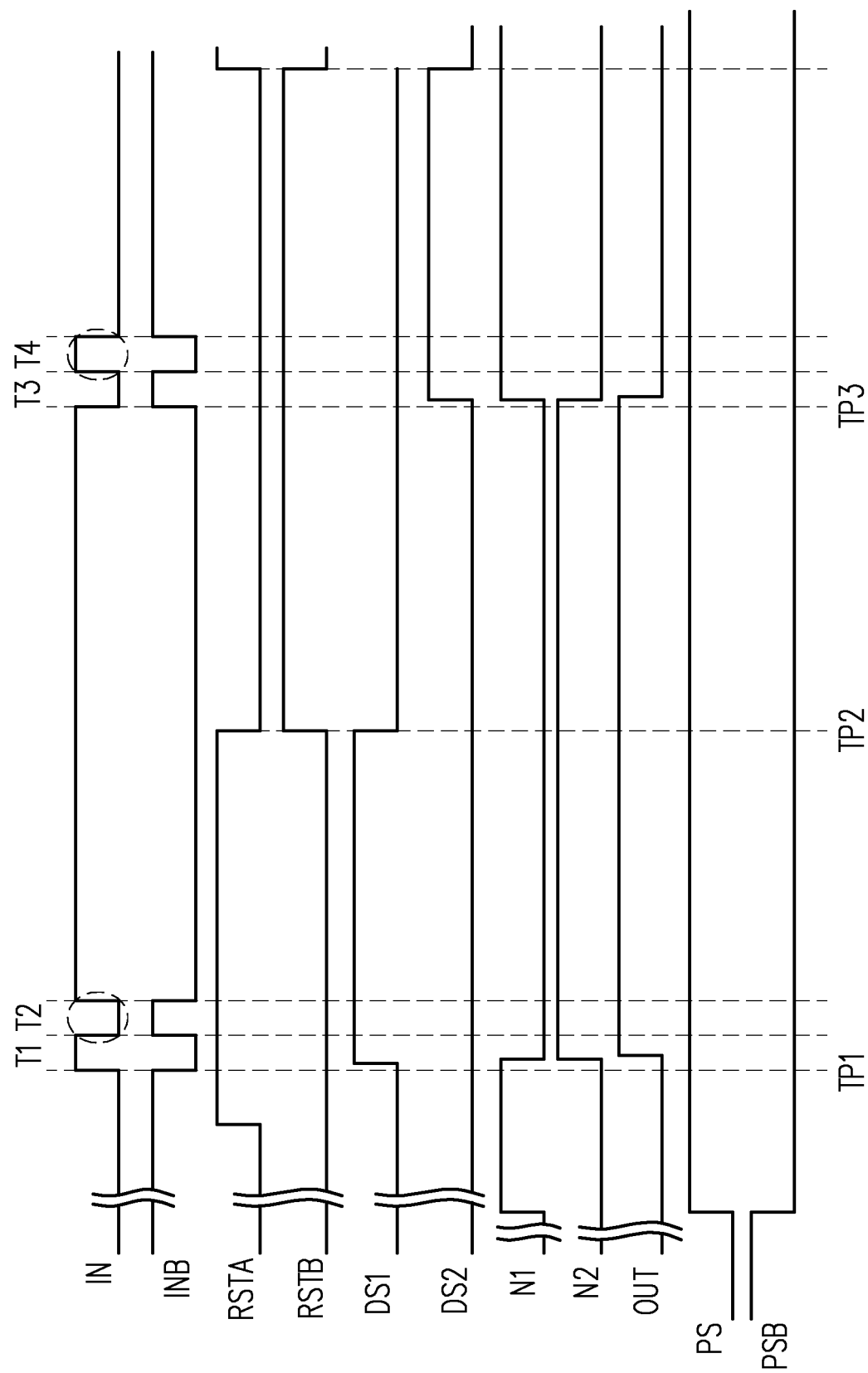
FIG. 4 is an operation waveform diagram of a glitch removal circuit according to an embodiment of the present disclosure.

Please refer to both of FIG. 3 and FIG. 4 below. FIG. 4 is an operation waveform diagram of a glitch removal circuit according to an embodiment of the present disclosure. In the initial state, the control signal PS may be the logic value 0 first and then the logic value 1 (the control signal PSB may be the logic value 1 first and then the logic value 0), so that the glitch removal circuit 300 completes the initialization operation. Next, under the condition that the input signal IN is a logic value 0, the control signals RSTA and RSTB may be a logic value 1 and a logic value 0, respectively.

At the time point TP1, the input signal IN changes from the logic value 0 to the logic value 1, the signal edge detector 311 is activated, and may detect the rising edge of the input signal IN and generate the detection result DS1 accordingly. It should be noted that in the time interval T2 following the time interval T1, the glitch of the falling pulse of the input signal IN occurs, but the signal edge detector 312 is not activated at this time. Therefore, the falling edge of the input signal IN occurred under the circumstances will not be reflected on the detection result DS2.

Based on the transition operation of the input signal IN (the logic value 0 is changed to the logic value 1), the latch signal 330 may generate the signals N1 and N2 with the logic value 0 and the logic value 1 respectively corresponding to the detection result DS1, and make the output signal OUT set to logic value 1.

At time point TP2, the control signal generator 320 changes the control signal RSTA to a logic value 0 and changes the control signal RSTB to a logic value 1 corresponding to the transition of the input signal IN. Next, at the time point TP3, the input signal IN is changed from the logic value 1 to the logic value 0, the signal edge detector 312 is activated, and may detect the falling edge of the input signal IN and generate the detection result DS2 accordingly. It should be noted that in the time interval T4 following the time interval T3, the glitch of the rising pulse occurs on the input signal IN, but the signal edge detector 311 is not activated at this time. Therefore, the rising edge of the input signal IN occurred under the circumstances will not be reflected on the detection result DS1.

Based on the transition operation of the input signal IN (the logic value 1 is changed to the logic value 0), the latch signal 330 may generate the signals N1 and N2 with the logic value 1 and the logic value 0 respectively corresponding to the detection result DS2, and make the output signal OUT cleared to logic value 0.

It is not difficult to see from the above description that the glitch on the input signal IN may be effectively eliminated through the operation of the glitch removal circuit 300. Moreover, the time latency between the output signal OUT and the input signal IN may also be effectively reduced, thereby improving the real-time nature and accuracy of signal transmission.

Figure 5:
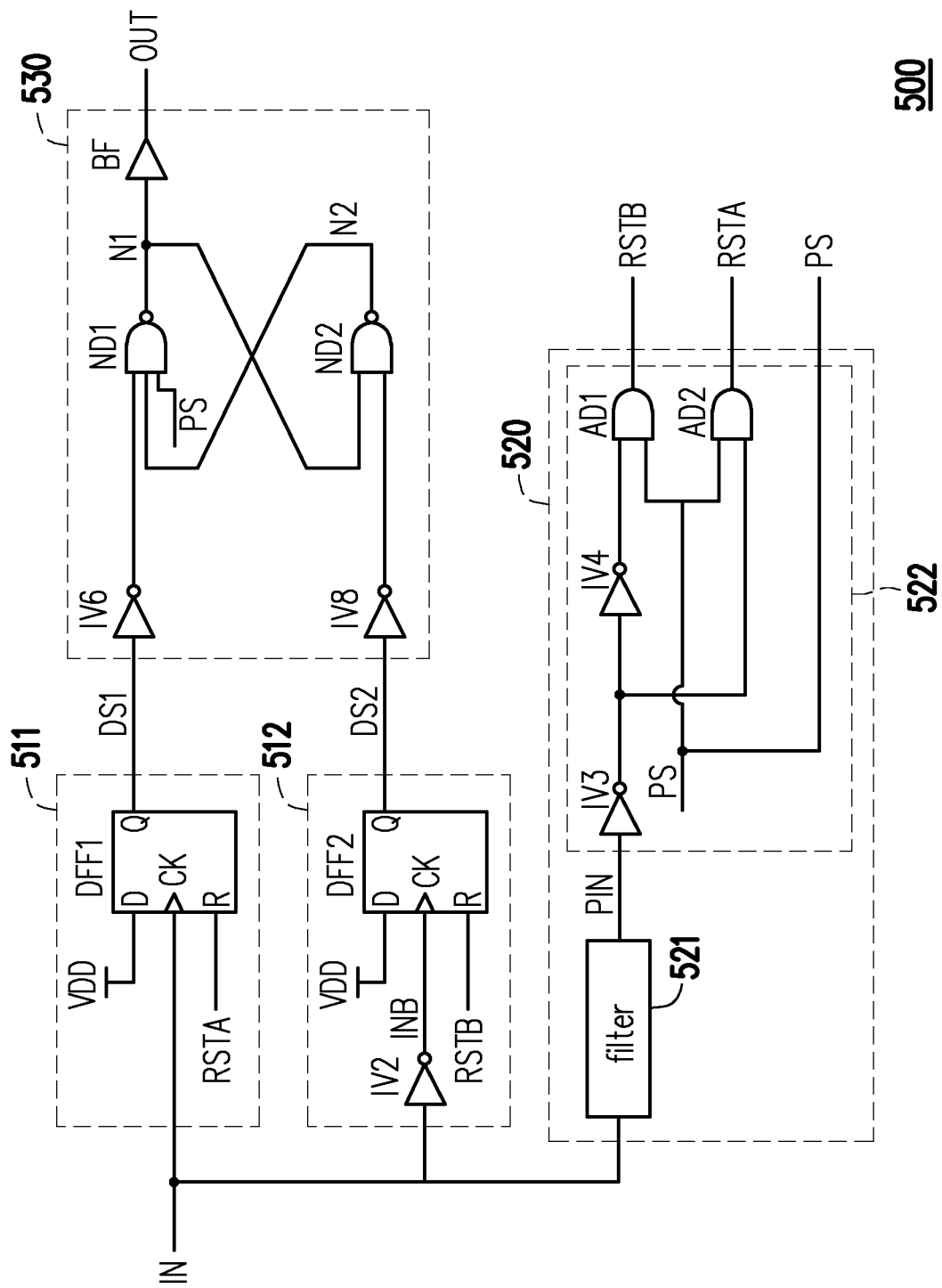
FIG. 5 is a schematic circuit diagram of a glitch removal circuit according to another embodiment of the present disclosure.

Please refer to FIG. 5, which is a schematic circuit diagram of a glitch removal circuit according to another embodiment of the present disclosure. The glitch removal circuit 500 includes signal edge detectors 511 and 512, a control signal generator 520 and a latch 530. The control signal generator 520 includes a filter 521 and a logic circuit 522. The glitch removal circuit 500 is substantially the same as the glitch removal circuit 300, and the same descriptions are not repeated here. Different from the embodiment shown in FIG. 3, the latch 530 of this embodiment includes inverters IV6 and IV8, NAND gates ND1 and ND2 and a buffer BF.

The inverter IV6 is arranged between the signal edge detector 511 and the NAND gate ND1, and the inverter IV8 is arranged between the signal edge detector 512 and the NAND gate ND2. Inverters IV6 and IV8 invert the detection results DS1 and DS2, respectively. The NAND gate ND1, the NAND gate ND2 and the buffer BF are coupled to form a circuit mode of the SR latch, and generate the output signal OUT according to the inversion of the detection results DS1 and DS2. The three input terminals of the NAND gate ND1 respectively receive the control signal PS, the signal N2 and the inversion of the detection result DS1. The two input terminals of the NAND gate ND2 respectively receive the signal N1 and the inversion of the detection result DS2. NAND gates ND1 and ND2 generate signals N1 and N2, respectively.

When the detection result DS1 is a logic value 0 and the detection result DS2 is a logic value 1, the latch 530 may set the output signal OUT to a logic value 1; when the detection result DS1 is a logic value 1 and the detection result DS2 is a logic value 0, the latch 530 may clear the output signal OUT to a logic value 0.

It should be mentioned that, in this embodiment, the number of inverter IV6 connected in series between the signal edge detector 511 and the NAND gate ND1 is one. In other embodiments, the number of inverters connected in series between the signal edge detector 511 and the NAND gate ND1 may be any odd number, which is not specifically limited in the disclosure. The number of inverter IV8 connected in series between the signal edge detector 512 and the NAND gate ND2 is one. In other embodiments, the number of inverters connected in series between the signal edge detector 512 and the NAND gate ND2 may be any odd number, which is not specifically limited in the disclosure.

It should be noted that, in this embodiment, the latch 530 does not need to receive the inverted signal of the control signal PS (e.g., the control signal PSB in FIG. 3). Therefore, the control signal generator 522 is not required to generate the control signal PSB.

Figure 6:
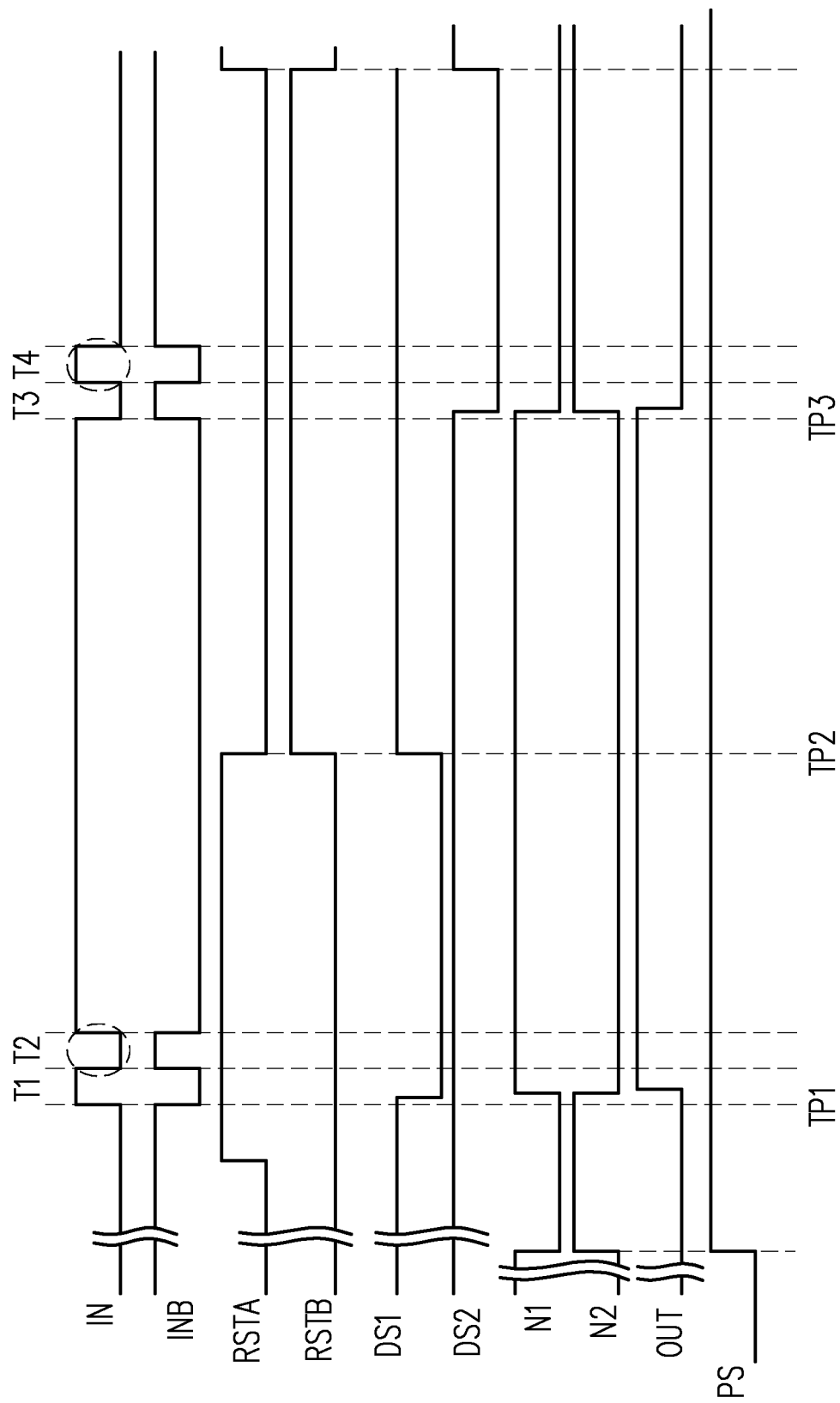
FIG. 6 is an operation waveform diagram of a glitch removal circuit according to an embodiment of the present disclosure.

Please refer to both of FIG. 5 and FIG. 6 below. FIG. 6 is an operation waveform diagram of a glitch removal circuit according to an embodiment of the present disclosure. In the initial state, the control signal PS may be the logic value 0 first and then the logic value 1 (the control signal PSB may be the logic value 1 first and then the logic value 0), so that the glitch removal circuit 300 completes the initialization operation. Next, under the condition that the input signal IN is a logic value 0, the control signals RSTA and RSTB may be a logic value 1 and a logic value 0, respectively.

At the time point TP1, the input signal IN changes from the logic value 0 to the logic value 1, the signal edge detector 511 is activated, and may detect the rising edge of the input signal IN and generate the detection result DS1 accordingly. It should be noted that in the time interval T2 following the time interval T1, the glitch of the falling pulse occurs in the input signal IN, but the signal edge detector 512 is not activated at this time. Therefore, the falling edge of the input signal IN under the circumstances will not be reflected on the detection result DS2.

Based on the transition operation of the input signal IN (the logic value 0 is changed to the logic value 1), the latch signal 530 may generate the signals N1 and N2 with the logic value 1 and the logic value 0 respectively corresponding to the detection result DS1, and make the output signal OUT set to logic value 1.

At time point TP2, the control signal generator 520 changes the control signal RSTA to a logic value 0 and changes the control signal RSTB to a logic value 1 corresponding to the transition of the input signal IN. Next, at time point TP3, the input signal IN is changed from a logic value 1 to a logic value 0, and the signal edge detector 512 is activated to detect the falling edge of the input signal IN and generate a detection result DS2 correspondingly. It should be noted that in the time interval T4 following the time interval T3, the glitch of the rising pulse occurs on the input signal IN, but the signal edge detector 511 is not activated at this time. Therefore, the rising edge of the input signal IN under the circumstances will not be reflected on the detection result DS1.

Based on the transition operation of the input signal IN (the logic value 1 is changed to the logic value 0), the latch signal 330 may generate the signals N1 and N2 with the logic value 0 and the logic value 1 respectively corresponding to the detection result DS2, and make the output signal OUT cleared to logic value 0.

According to the above, the glitch removal circuit of the embodiment of the present disclosure may quickly generate the output signal corresponding to the transition state by detecting the rising edge and the falling edge of the input signal, which can effectively reduce the time latency between the output signal and the input signal. In addition, the glitch removal circuit of the embodiment of the present disclosure performs the detection of the rising edge and the falling edge of the input signal by the two signal edge detectors being activated respectively, thus eliminating the effect of the glitch on the output signal that occurs during the state transition of the input signal. The resulting effect can effectively eliminate the glitch of the input signal and maintain the accuracy of the output signal.

Finally, it should be noted that the above embodiments are only used to illustrate the technical solutions of the present disclosure, but not to limit them. Although the present disclosure has been described in detail with reference to the foregoing embodiments, those of ordinary skill in the art should understand that the technical solutions described in the foregoing embodiments can still be modified, or some or all of the technical features thereof can be equivalently replaced; and these modifications or replacements do not make the essence of the corresponding technical solutions deviate from the technical solutions of the embodiments of the present disclosure.

What is claimed is:

1. A glitch removal circuit, comprising:
    a first signal edge detector, receiving an input signal and activated according to a first control signal to detect a rising edge of the input signal to generate a first detection result;
    a second signal edge detector, receiving the input signal and activated according to a second control signal to detect a falling edge of the input signal to generate a second detection result;
    a latch, coupled to the first signal edge detector and the second signal edge detector, setting a generated output signal according to the first detection result, and clearing the generated output signal according to the second detection result; and
    a control signal generator, generating a processed signal by shielding a glitch on the input signal, and generating the first control signal and the second control signal according to the processed signal,
    wherein the control signal generator comprises:
        a filter, configured for receiving the input signal and shielding the glitch on the input signal to generate the processed signal; and
        a logic circuit, coupled to the filter, performing a logic operation according to the processed signal and an external reset input signal to generate the first control signal and the second control signal.

2. The glitch removal circuit according to claim 1, wherein the first signal edge detector is a first flip-flop, a reset terminal of the first flip-flop receives the first control signal, a data terminal of the first flip-flop receives a first logic value, a clock terminal of the first flip-flop receives the input signal, and an output terminal of the first flip-flop generates the first detection result.

3. The glitch removal circuit according to claim 2, wherein the second signal edge detector comprises:
    an inverter, receiving the input signal and generating an inverted input signal; and
    a second flip-flop, wherein a reset terminal of the second flip-flop receives the second control signal, a data terminal of the second flip-flop receives the first logic value, a clock terminal of the second flip-flop receives the inverted input signal, and an output terminal of the second flip-flop generates the second detection result.

4. The glitch removal circuit according to claim 3, wherein the first flip-flop and the second flip-flop are D-type flip-flops.

5. The glitch removal circuit according to claim 1, wherein when the first control signal is a first logic value, the first signal edge detector is activated, and when the first control signal is a second logic value, the first signal edge detector is not activated; when the second control signal is the first logic value, the second signal edge detector is activated, and when the second control signal is the second logic value, the second signal edge detector is not activated, and the first logic value is different from the second logic value.

6. The glitch removal circuit according to claim 1, wherein the filter is configured to shield the glitches with a width of less than 15 nanoseconds in the input signal to generate the processed signal.

7. The glitch removal circuit according to claim 6, wherein the filter is a resistance-capacitance filter.

8. The glitch removal circuit according to claim 1, wherein the logic circuit comprises:
   a first inverter, receiving the processed signal and generating a first signal;
   a second inverter, receiving the first signal and generating a second signal;
   a third inverter, receiving the external reset input signal and generating a third control signal;
   a first AND gate, receiving the first signal and the external reset input signal, and generating the first control signal; and
   a second AND gate, receiving the second signal and the external reset input signal, and generating the second control signal.

9. The glitch removal circuit according to claim 8, wherein the latch comprises:
   a first NOR gate, performing an NOR logic operation according to the first detection result, the third control signal and a third signal to generate a fourth signal;
   a second NOR gate, performing the NOR logic operation according to the second detection result and the fourth signal to generate the third signal; and
   a fourth inverter, receiving the fourth signal to generate the output signal.

10. The glitch removal circuit according to claim 9, wherein the latch further comprises:
    an even number of fifth inverters, coupled in series between the first signal edge detector and the first NOR gate; and
    an even number of sixth inverters, coupled in series between the second signal edge detector and the second NOR gate.

11. The glitch removal circuit according to claim 1, wherein the logic circuit comprises:
    a first inverter, receiving the processed signal and generating a first signal;
    a second inverter, receiving the first signal and generating a second signal;
    a first AND gate, receiving the first signal and the external reset input signal, and generating the first control signal; and
    a second AND gate, receiving the second signal and the external reset input signal, and generating the second control signal.

12. The glitch removal circuit according to claim 11, wherein the latch comprises:
    an odd number of third inverters, coupled in series with each other, receiving the first detection result and generating a first inversion detection result;
    an odd number of fourth inverters, coupled in series with each other, receiving the second detection result and generating a second inversion detection result;
    a first NAND gate, performing an NAND logic operation according to the first inversion detection result, the external reset input signal and a third signal to generate a fourth signal;
    a second NAND gate, performing the NAND logic operation according to the second inversion detection result, and the fourth signal to generate the third signal; and
    a buffer, receiving the fourth signal to generate the output signal.

* * * * *